(12) United States Patent
Kincade

(10) Patent No.: US 11,520,234 B2
(45) Date of Patent: Dec. 6, 2022

(54) METHOD OF MITIGATING DEFECTS ON AN OPTICAL SURFACE AND MIRROR FORMED BY SAME

(71) Applicant: Zygo Corporation, Middlefield, CT (US)

(72) Inventor: John Matthew Kincade, Vacaville, CA (US)

(73) Assignee: Zygo Corporation, Middlefield, CT (US)

(*) Notice: Subject to any disclaimer, the term of this patent is extended or adjusted under 35 U.S.C. 154(b) by 0 days.

(21) Appl. No.: 17/074,674

(22) Filed: Oct. 20, 2020

(65) Prior Publication Data

US 2021/0124270 A1  Apr. 29, 2021

Related U.S. Application Data

(60) Provisional application No. 62/927,429, filed on Oct. 29, 2019.

(51) Int. Cl.
*G03F 7/20* (2006.01)
*G02B 5/08* (2006.01)
*G02B 5/10* (2006.01)

(52) U.S. Cl.
CPC ....... *G03F 7/70033* (2013.01); *G02B 5/0891* (2013.01); *G02B 5/10* (2013.01); *G03F 7/7015* (2013.01)

(58) Field of Classification Search
CPC . G03F 7/70033; G03F 7/7015; G02B 5/0891; G02B 5/10
USPC .......................................................... 355/67
See application file for complete search history.

(56) References Cited

U.S. PATENT DOCUMENTS

| 4,924,490 A | 5/1990 | Hashimoto et al. |
| 2003/0043483 A1* | 3/2003 | Folta ...................... G02B 5/283 359/883 |
| 2003/0194615 A1 | 10/2003 | Krauth |
| 2009/0264316 A1* | 10/2009 | Blough ................. G03F 7/2043 506/15 |

(Continued)

FOREIGN PATENT DOCUMENTS

| CN | 102269929 B | 9/2013 | ............. G03F 7/004 |
| CN | 107561609 B | 10/2019 | ............... G02B 5/08 |

(Continued)

OTHER PUBLICATIONS

Bhushan, B., Modern Tribology Handbook, Chapter 2, Section 2.2, Analysis of Surface Roughness, CRC Press, LLC (2001).

(Continued)

*Primary Examiner* — Hung V Nguyen
*Assistant Examiner* — Hung Henry Nguyen
(74) *Attorney, Agent, or Firm* — Fish & Richardson P.C.

(57) ABSTRACT

A method of making a mirror for use with extreme ultraviolet (EUV) or X-ray radiation is disclosed. The method includes: a) providing an optical element having a curved mirror surface, wherein the curved mirror surface comprises localized defects that degrade performance of the curved mirror surface; b) spin-coating the curved mirror surface with a material to cover at least some of the defects; and c) curing the spin-coated material on the curved mirror surface to reduce the number of defects and improve the performance of the curved mirror surface. Also disclosed is a mirror made by the method.

27 Claims, 4 Drawing Sheets

(56) References Cited

U.S. PATENT DOCUMENTS

| | | | |
|---|---|---|---|
| 2011/0293888 A1 | 12/2011 | Stowers et al. | |
| 2013/0078555 A1* | 3/2013 | Orihara | G03F 1/60 430/5 |
| 2013/0335816 A1* | 12/2013 | Kierey | G02B 1/10 359/359 |
| 2016/0377769 A1 | 12/2016 | Hamamoto et al. | |

FOREIGN PATENT DOCUMENTS

| | | | | |
|---|---|---|---|---|
| DE | 102009032194 | 4/2010 | | G02B 5/10 |
| TW | 201826030 A | 7/2018 | | G03F 7/115 |
| TW | I652549 | 3/2019 | | G03F 7/115 |

OTHER PUBLICATIONS

Salmassi, Farhad, et al., "Spin-on-glass coatings for the generation of super-polished substrates for extreme ultraviolet optics", Center for X-Ray Optics, Lawrence Berkeley National Laboratory, *Applied Optics*, vol. 45, No. 11, pp. 2404-24088 (May 2006).

Salmassi, Farhad, et al., "Spin-on-glass smoothing of diamond turned optics for use in the extreme ultraviolet regime", Center for X-Ray Optics, Lawrence Berkeley National Laboratory, *Proceedings of SPIE*, vol. 6883, pp. 68830F-1-68830F-5 ( Feb. 12, 2008).

Soufli, Regina, et al, "Smoothing of diamond turned substrates for extreme ultraviolet lithography illuminators" *Proceedings of SPIE*, vol. 5193, pp. 98-104 (Jan. 13, 2004).

Teki, R., et al., "Alternative smoothing techniques to mitigate EUV substrate defectivity", *Proceedings of SPIE*, vol. 8322, pp. 83220B-1-83220B-12 (Mar. 22, 2012).

Wheelock, Scott A., et al., Dow Corning Corporation, "Spin-On Inter-Metal Dielectric Materials: Hydrogen Silsesquioxane versus Methylsiloxane", Semicon China (2003).

The International Search Report and Written Opinion of the International Searching Authority for International Application No. PCT/US2020/056495, dated Jan. 25, 2021.

The Examination Report and Search Report issued by the Taiwan Patent Office for Application No. TW 109137222 dated Dec. 29, 2021 (with English Translation).

The International Preliminary Report on Patentability for International Application No. PCT/US2020/056495, dated May 12, 2022.

The Office Action and Search Report issued by the Taiwan Patent Office for Application No. TW 109137222 dated Aug. 31, 2022 (With English Translation).

\* cited by examiner

METHOD OF MITIGATING DEFECTS ON AN OPTICAL SURFACE AND MIRROR FORMED BY SAME

CROSS REFERENCE TO RELATED APPLICATION

This application claims priority to U.S. Provisional Patent Application No. 62/927,429, filed on Oct. 29, 2019, pursuant to 35 USC § 119. The entire content of this provisional application is herein incorporated by reference in its entirety.

FIELD

This disclosure relates to a method of mitigating defects on an optical surface, including mirror elements for extreme-ultraviolet (EUV) and X-ray radiation, and mirror elements formed by such methods.

BACKGROUND

Cutting-edge optical systems, such as microlithography system for making semiconductor chips, use electromagnetic radiation in the extreme-ultraviolet ("EUV") and X-ray regions. Such regions have small wavelengths in the range of 1-20 nm, which can enable the design of optical systems that can reproduce patterns with extremely fine resolution. The optical components for such systems involve reflective elements because of the strong absorption of EUV and X-ray radiation in most materials. Accordingly, such reflective elements need to have reflective surfaces of extremely high-quality, including surfaces that conform to precisely optimized curvatures and forms and that are also extremely smooth.

Techniques exist for figuring, polishing, and otherwise finishing such surfaces, including, e.g., ion-beam figuring ("IBF"), magneto-rheological finishing ("MRF"), chemical mechanical polishing ("CMP"), and computer controlled optical surfacing ("CCOS"). However, such techniques are generally expensive and time-consuming for the tolerances required for EUV and X-ray optics. Moreover, the constraints on such techniques are exacerbating by the requirement to process the non-planar surface required for the design of the reflective optical elements currently proposed for cutting-edge EUV lithography systems, including not only aspheric elements, but also non-rotationally symmetric elements such as free-form grazing incidence mirrors.

A measure commonly used to characterize the degree to which an optic surface is sufficiently "smooth" is surface roughness. Surface roughness is the repetitive and/or random deviation from the nominal surface that forms the three-dimensional topology of the surface. Especially relevant for EUV and X-ray optics is high-spatial frequency roughness ("HSFR") corresponding to deviations on the micrometer to nanometer size scale (e.g., spatial periods from about 10 microns to 10 nanometers) because such roughness causes scattering loses that lowers the transmission throughput of EUV and X-ray optical system implementing such optics. Lower spatial frequency deviations such as waviness can generally be corrected during the figuring process (at least, for example, for spatial periods greater than about 1-2 mm). Waviness can be caused by workpiece deflections, vibrations, chatters, heat treatment, or warping strains. HSFR, on the other hand, is typically an intrinsic consequence of the polishing process (e.g., randomized effects of polishing grit). HSFR includes hills (aspherities) (local maxima) and valleys (local minima) of varying amplitudes and spacings that are large compared to molecular dimensions.

Roughness R is usually characterized by one of the two statistical height descriptors advocated by the American National Standards Institute (ANSI) and the International Standardization Organization (ISO) (Anonymous, 1975, 1985) (see, e.g., ISO 10110-8). These are (1) Ra, CLA (center-line average), or AA (arithmetic average) and (2) the standard deviation or variance ($\sigma$), Rq or root mean square (RMS). While not critical to the present invention, for the present application, HSFR be will defined according to the root mean square of the vertical deviation of the three-dimensional surface topography from the nominal three-dimension surface topography corresponding to the design surface for the optic with respect to high spatial frequencies (e.g., spatial periods below 10 microns). For example, for a sampling region extending along a line of length L extending along an x-axis of a surface having an actual surface topography z(x) relative to a nominal surface topography z'(x) for scale lengths L up to 10 microns, the high spatial frequency roughness R is:

$$R = \sqrt{\frac{1}{L}\int_0^L |z(x) - z'(x)|^2 dx}$$

HSFR can be measured with an atomic force microscope ("AFM") or an optical interferometer. To make timely measurements of HSFR with nanometer-scale lateral resolutions and because HSFR is understood to result from intrinsic properties of the polishing, HSFR measurements are typically made over areas no larger than 50 microns by 50 microns, and more typically on the order 10 microns by 10 microns.

For normal incidence EUV mirrors, the required tolerances for HSFR can be less than a few Angstroms (e.g., R<0.2 nm) to avoid scattering losses. Although still very strict, the tolerances can be increased somewhat for grazing incidence mirrors because scattering decreases at increased incident angles (e.g., R<0.5 nm). For example, in the publication "Spin-on-glass smoothing of diamond turned optics for use in the extreme ultraviolet regime" by "Salmassi et al., in Proc. SPIE 6683, 66830 F1 (February 2008), HSFR was reduced from 6.6 nm rms to 0.45 nm by spin-coating a thin layer of glass over a substrate figured for use as a grazing-incidence, cylindrical fly-eye for an EUV optical system. An AFM was used over a 50-micron by 50-micron region of the substrate to determine the HSFR.

SUMMARY

The inventor has recognized that the tolerances for reflective EUV optics require not only very small HSFR, but also very few surface defects, and that spin-coating techniques can also be used to reduce the number of defects. Any area on the surface of a material that is discontinuous and discreet that does not follow the natural texture of the surface or its roughness is classified as a defect (or equivalently a "flaw"). For example, defects include scratches, pits, and digs. The size of a defect along its shortest lateral dimension is typically less than 1000 nm, or more typically less than 500 nm; but larger than the size scale for HSFR that gives rise to diffuse scatter. Unfortunately, such defects can be easily overlooked when preparing super-polished substrates for EUV optics. First, such optics are typically characterized for HSFR and the inspection area for a HSFR measurement (e.g., 10-microns by 10-microns) is much smaller than the usable area of the optic (e.g., an area on the order of at least a few square millimeters), so the HSFR measurement will not observe defects outside the inspection area. Second, even if a defect were observed in the HSFR inspection area, it is commonly disregarded as an anomaly and excluded from the HSFR calculation because it would otherwise skew the HSFR result. Third, there is a failure to appreciate the necessary defect tolerances for EUV optics. For example, certain optics require fewer than 1 defect per 1 square millimeter area over the entire usual area of the optic, e.g., 1 to 100,000 square millimeters in area or even larger.

In general, in one aspect, a method of making a mirror for use with extreme ultraviolet (EUV) or X-ray radiation is disclosed. The method includes: a) providing an optical element having a curved mirror surface, wherein the curved mirror surface comprises localized defects that degrade performance of the curved mirror surface; b) spin-coating the curved mirror surface with a material to cover at least some of the defects; and c) curing the spin-coated material on the curved mirror surface to reduce the number of defects and improve the performance of the curved mirror surface.

Embodiments of the method may include any of the following features.

The mirror surface may have a high spatial frequency surface roughness HSFR of less than 1 nm, or even less than 0.45 nm, before the spin-coating.

The method may further include characterizing the number of defects on the mirror surface before the spin-coating, characterizing the number of defects on the mirror surface after the spin-coating, or characterizing the number of defects on the mirror surface before and after the spin-coating. For example, the characterizing may include inspecting the mirror surface with an optical microscope, such as a confocal microscope, over an area greater than 1 mm$^2$.

The optical element may include a substrate made of any of: silicon, fused silica, quartz silicon, titanium-doped silica, glass ceramic, and polishable ceramic. The mirror may be for use in a wavelength range between 1 and 20 nm. The curved mirror surface may be an aspheric mirror surface.

The defects may include any of scratches, pits, and digs having at least one lateral dimension smaller than 500 nm.

The spin-coating may include: a) depositing the material onto the curved mirror surface in the vicinity of a spin-coating rotation axis for the curved surface; and b) rotating the curved surface of the optical element about the rotation axis so that the glass-like material flows radially outward to cover the curved mirror surface and form a thin film. For example, the rotating may include rotating the optical element at between 1000 to 5000 rotations per minute. For example, the thin film may be between 50 and 500 nm thick, or more narrowly between 100 and 400 nm thick. The spin-coating may further include rotating the curved surface after the deposition of the material to spin-off and evaporate excess material as the thin film is formed. The spin coating may further include heating the curved mirror surface to help evaporate any solvents for the material.

The curing may include heating the spin-coated substrate in an oven in the presence of at least one of ozone and UV radiation. For example, the oven may be heated to a temperature between 100 degrees Celsius and 600 degrees Celsius.

The spin-coating material may be a glass-like material, such as hydrogen silsesquioxane or methylsiloxane.

After the curing, the number of defects may be reduced to less than 1 defect per 1 square millimeter over the usable area of the curved mirror surface.

The method may further include coating the cured, spin-coated mirror surface with multiple optical layers to provide a reflective mirror surface for the EUV or X-ray radiation. For example, the multiple layers may include layers of molybdenum and silicon.

In general, in another aspect, a mirror for use with extreme ultraviolet (EUV) or X-ray radiation is disclosed. The mirror includes: a) an optical element having a curved mirror surface, wherein the curved mirror surface comprises localized defects that degrade performance of the curved mirror surface; and b) a thin film formed on the curved mirror surface by: i) spin-coating the curved mirror surface with a material to cover at least some of the defects; and ii) curing the spin-coated material on the curved mirror surface to reduce the number of defects and improve the performance of the curved mirror surface.

Embodiments of the mirror may include any of the following features.

The mirror surface may have a high spatial frequency surface roughness HSFR of less than 1 nm, or even less than 0.45 nm, before the spin-coating.

The optical element may include a substrate made of any of: silicon, fused silica, quartz silicon, titanium-doped silica, glass ceramic, and polishable ceramic. The mirror may be for use in a wavelength range between 1 and 20 nm. The curved mirror surface may be an aspheric mirror surface.

The defects may include any of scratches, pits, and digs having at least one lateral dimension smaller than 500 nm.

The spin-coating may include: a) depositing the material onto the curved mirror surface in the vicinity of a spin-coating rotation axis for the curved surface; and b) rotating the curved surface of the optical element about the rotation axis so that the glass-like material flows radially outward to cover the curved mirror surface and form a thin film. For example, the rotating may include rotating the optical element at between 1000 to 5000 rotations per minute. For example, the thin film may be between 50 and 500 nm thick, or more narrowly between 100 and 400 nm thick. The spin-coating may further include rotating the curved surface after the deposition of the material to spin-off and evaporate excess material as the thin film is formed. The spin coating may further include heating the curved mirror surface to help evaporate any solvents for the material.

The curing may include heating the spin-coated substrate in an oven in the presence of at least one of ozone and UV radiation. For example, the oven may be heated to a temperature between 100 degrees Celsius and 600 degrees Celsius.

The spin-coating material may be a glass-like material, such as hydrogen silsesquioxane or methyl siloxane.

After the curing, the number of defects may be reduced to less than 1 defect per 1 square millimeter over the usable area of the curved mirror surface.

The mirror may further include multiple optical layers coated onto the cured, spin-coated mirror surface to provide a reflective mirror surface for the EUV or X-ray radiation. For example, the multiple layers may include layers of molybdenum and silicon.

All documents referred to herein are incorporated by reference in their entirety. In case of conflict with the present disclosure, and any document incorporated by reference, the present disclosure controls.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
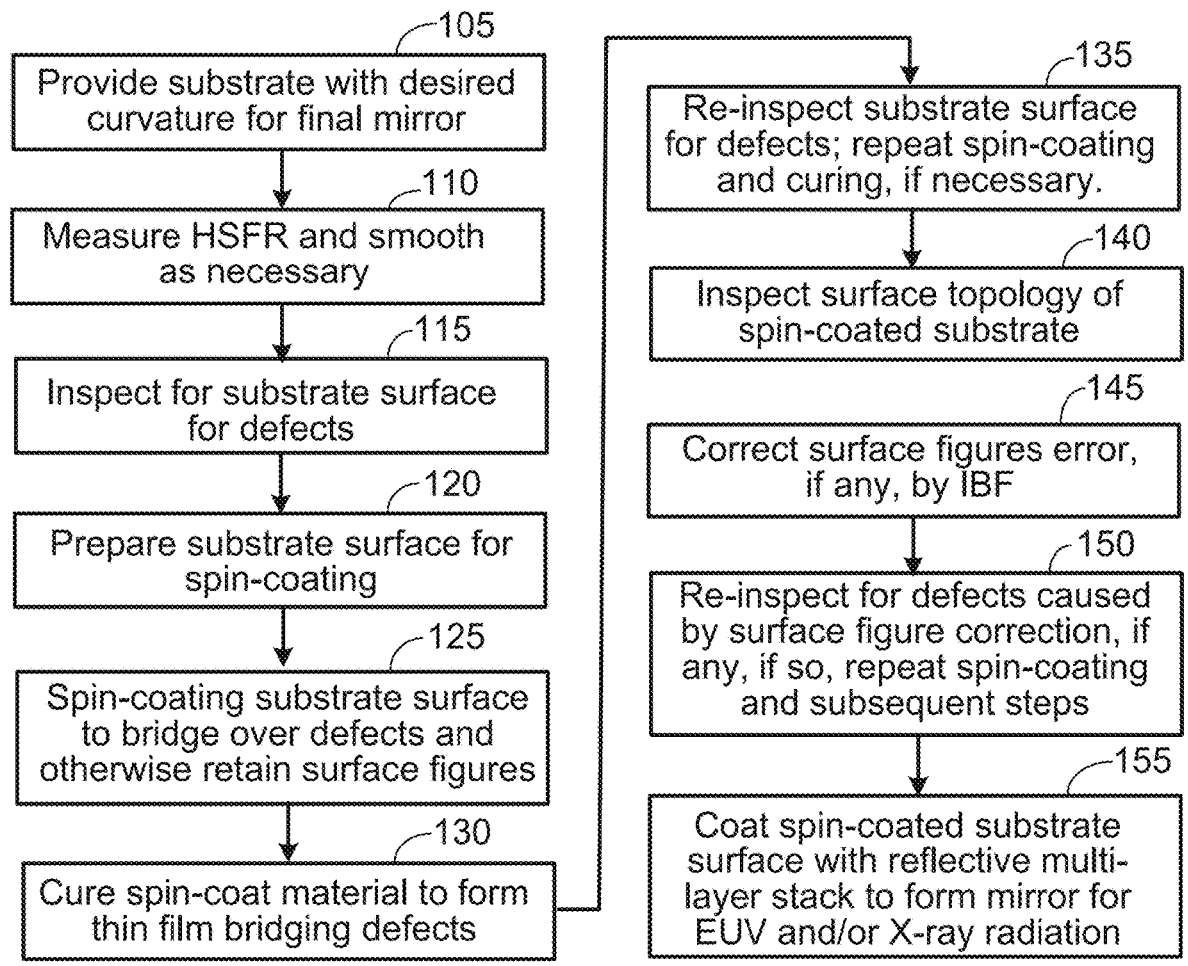
FIG. 1 is a flow chart describing embodiments for making a curved mirror for use with extreme ultraviolet (EUV) or X-ray radiation.

FIG. 1 is a flow chart describing embodiments for making a curved reflective element (i.e., a curved mirror) for use with extreme ultraviolet (EUV) or X-ray radiation.

In step 105, a substrate is provided. The substrate can be made of material typically used in EUV and X-ray optical systems. Preferably the material is compatible with the subsequent deposition of alternating multiple thin layers such as molybdenum and silicon to provide Bragg reflectivity for the final mirror. For example, the substrate material can be silicon, fused silica, titanium-oxide doped silica, and ULE®-glass from Corning. Furthermore, the substrate material can be a glass ceramic or another polishable ceramic. The substrate has a surface topology corresponding to a desired curvature for the final mirror. For example, the curvature can be spherical or aspherical, but rotationally symmetric. Furthermore, the curvature can be a free-form curvature that is not rotationally symmetric. A desired rotationally symmetric curvature can be achieved by using conventional diamond turning machines. Further refinements, including localized and/or free-form deviations from rotational symmetry can be achieved by ion-beam figuring ("IBF"). To distinguish from substrates intended to be nominally planar, for example, the substrate curvature can have an absolute sagittal dimension greater than at least 10 microns, or even greater than 100 microns.

Figure 2:
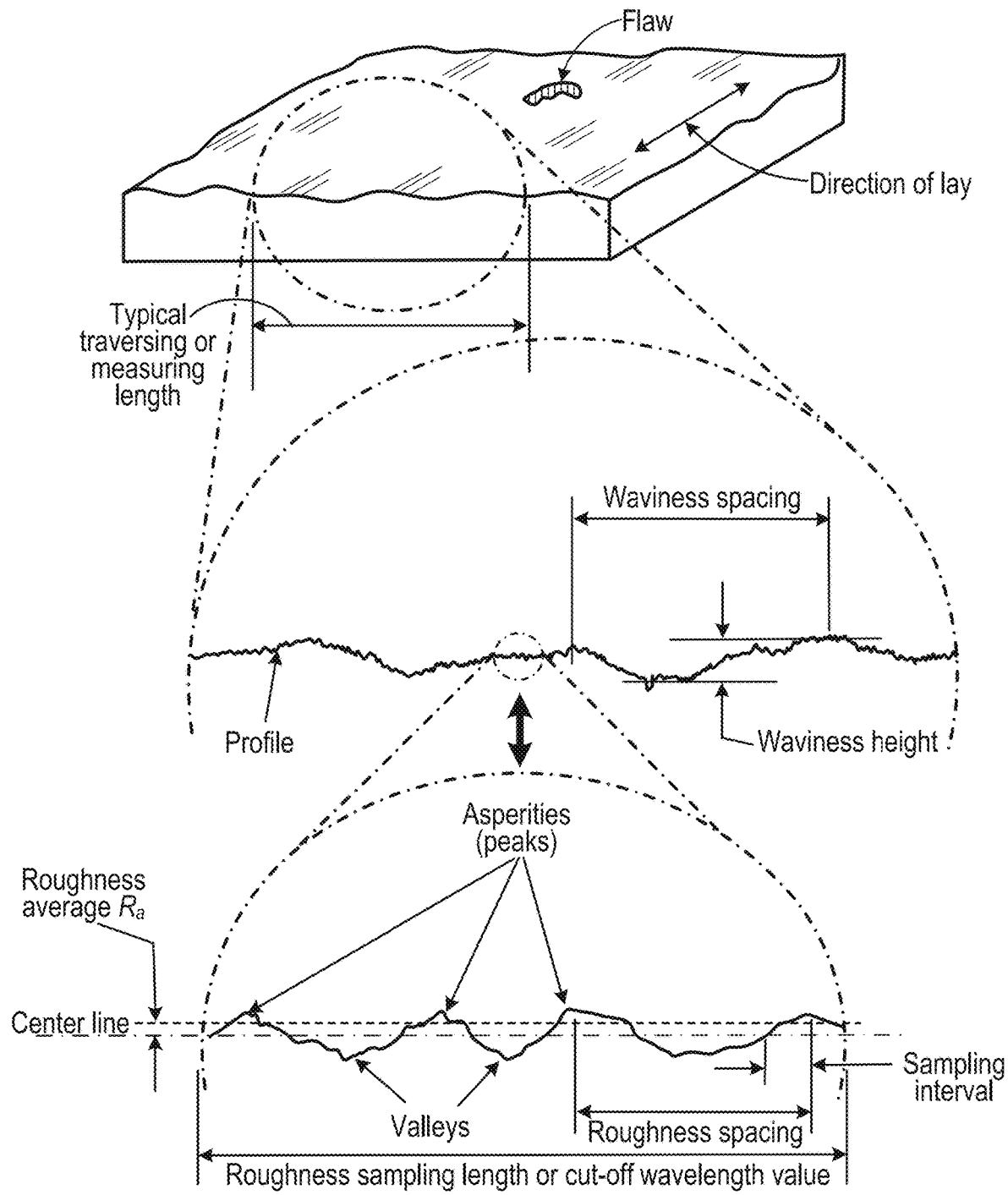
FIG. 2 is a schematic that depicts roughness R, including low and high spatial frequency roughness, on a substrate surface.

In step 110, the high spatial frequency roughness ("HSFR") of the substrate is measured and if it is too high, the substrate can be smoothed using polishing techniques such as MRF and CMP. Ideally, the HSFR is reduced to less than 2 nm, or less than 1 nm, or less than 0.45 nm, or even less than 0.3 nm. For example, an AFM can be used over a 50-micron by 50-micron region of the substrate to determine the HSFR. Alternatively, optical interferometric microscopes for measuring topology can be used for measuring the HSFR. As noted above, HSFR can be measured according to ISO 10110-8. FIG. 2 is a schematic figure from Chapter 2, Section 2.2 of the Modern Tribology Handbook by B. Bhushan that depicts roughness R, including low and high spatial frequency roughness, on a substrate surface.

In step 115, the substrate is inspected to identify and quantify defects. As noted above, any area on the surface of a material that is discontinuous and discreet that does not follow the natural texture of the surface or its roughness is classified as a defect (or equivalently a "flaw"). For example, defects include scratches, pits, and digs. In this step, the substrate is inspected over a larger area than that used to measure roughness to ensure defects are not overlooked. For example, the substrate can be inspected over the usable area of the optic (e.g., an area on the order of at least a few square millimeters). The inspection of the substrate for defects can be done with optical microscope, such as a confocal microscope. The defects can be characterized according to standards such as Military Specification MIL-0-13830 or International Standards Organization ISO 10110-7. Assuming at least some defects are observed, the method of FIG. 1 continues with the subsequent steps. For the EUV and X-ray optics that are of particular interest here, the defects can include, for example, any of scratches, pits, and digs having at least one lateral dimension smaller than, for example, 1000 nm, or even smaller than 500 nm. Depending on the required tolerances of the mirror, the subsequent steps will continue even if the number of defects observed are fewer than 10 defects per 1 square millimeter over the entire usual area of the optic, or, in some embodiments, even fewer than 5 defects per 1 square millimeter area over the entire usual area of the optic, or, in some further embodiments, even fewer than 2 defects per 1 square millimeter over the entire usual area of the optic.

In step 120, the substrate is prepared for spin-coating to reduce the number of defects observed in step 115. The preparation can include, for example, one or more of: i) cleaning the substrate surface with a detergent; ii) flushing the substrate surface with de-ionized water; iii) further cleaning the substrate surface with a solvent; and iv) drying the substrate surface with an inert gas such as nitrogen with a nitrogen gun.

In step 125, the prepared substrate is mounted in a spin-coating machine and spin-coated. For example, the substrate can be mounted by vacuum on a turn-table, and an automated dispense unit deposits a known amount of spin-coat material onto the substrate surface in the vicinity of the rotation axis for the turn-table. The turn-table is then rotationally accelerated up to a final spinning rate to cause the spin-coat material flow to the edges of the substrate and evenly coat substrate surface with a thin film of the spin-coat material.

Figure 3:
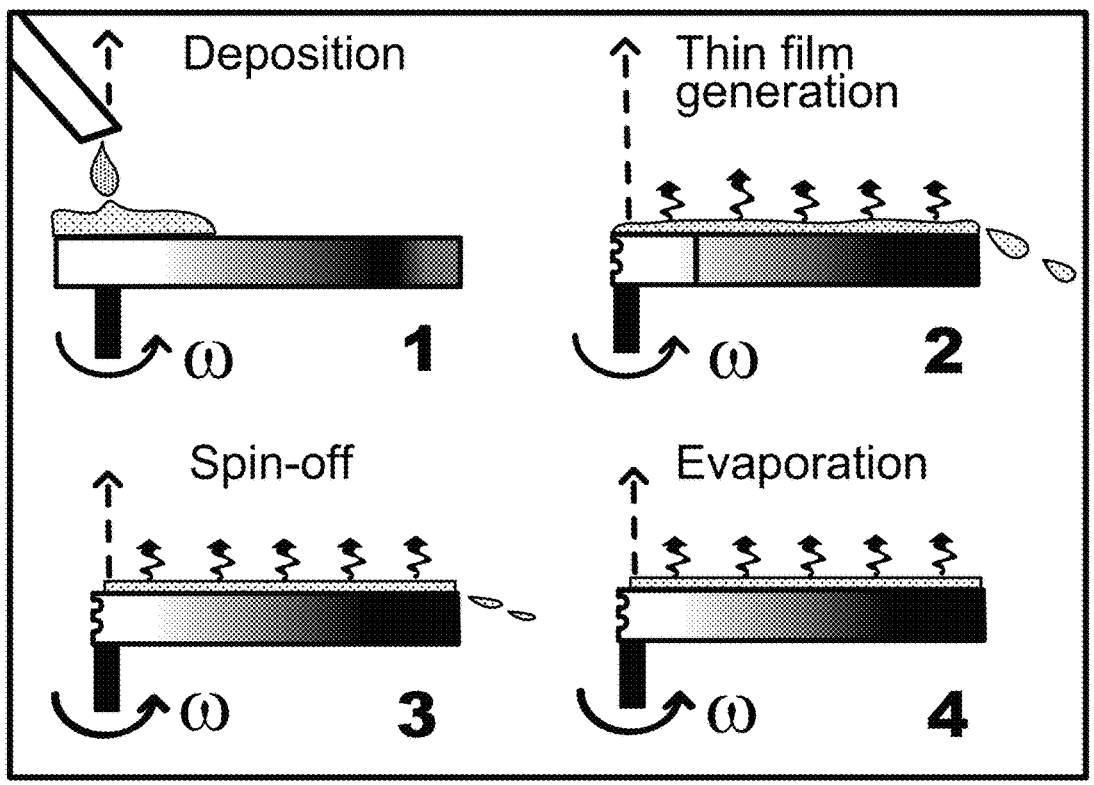
FIG. 3 is a schematic depiction of a spin-coating process for forming a thin film on a substrate.

One embodiment of the process is depicted schematically in FIG. 3, which shows: 1) the deposition of the spin coat material onto the substrate; 2) rotation of the substrate at angular frequency co to form the thin film; 3) continued spinning to ensure evenness of the thin film; and 4) evaporation of any solvent in the spin-coat material in preparation for subsequent curing. Suitable materials for the spin-coat material include glass-like materials such as hydrogen silsesquioxane (HSQ") and methylsiloxane, as well as spin-coat polymers such as polyimides.

Figure 4:
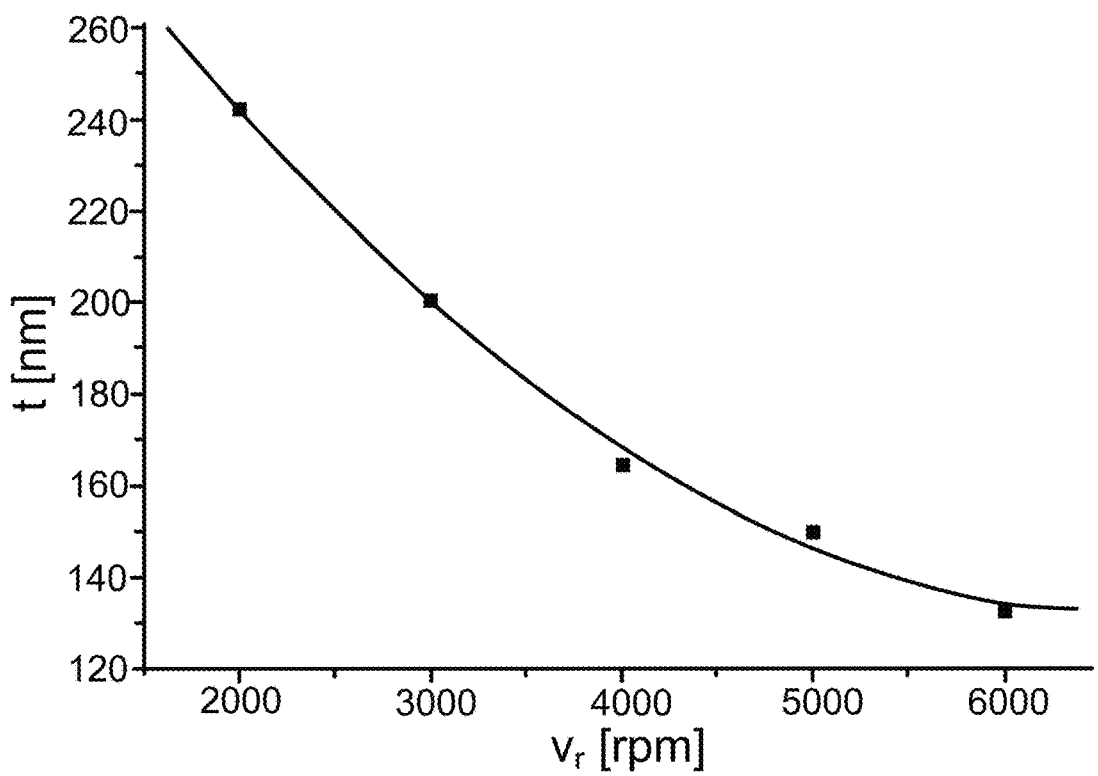
FIG. 4 is a graph depicting a representative variation in thin-film thickness relative to the spinning speed of a turntable in a spin-coating machine.
Figure 5:
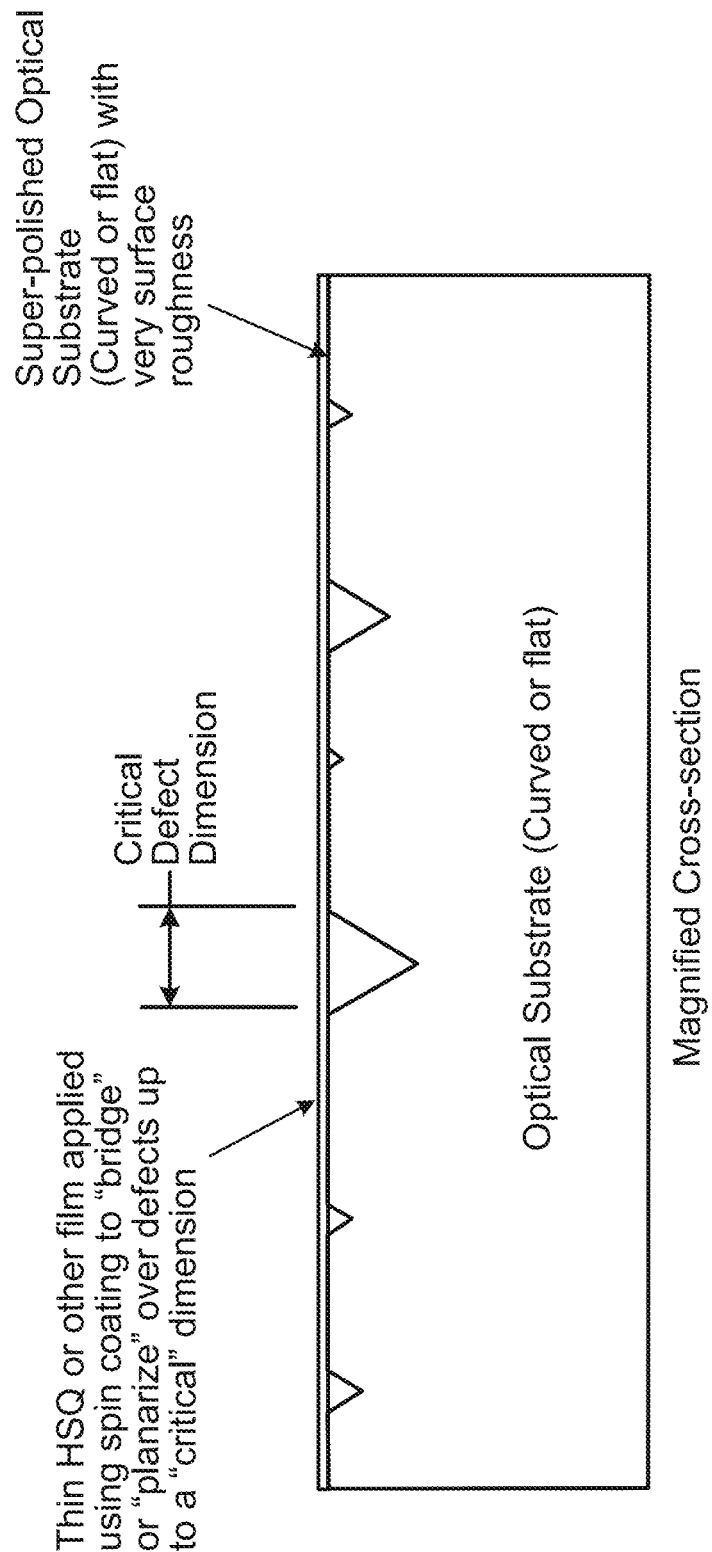
FIG. 5 is a schematic depiction of the spin-coated thin film bridging defects on the substrate surface.

The thickness of the thin film formed on the substrate during the spin-coat process will depend on the angular frequency of the spinning and the viscosity of the spin-coat material. For example, the final spinning rate can be in the range of 1000 to 5000 rotations per minute ("rpm") and the desired film thickness can be between 50 and 500 nm, for example, between 100 and 300 nm. FIG. 4 is a graph showing an exemplary relationship between spinning rate $v_r$ and thin film thickness t. The thin film formed on the substrate surface can smoothly bridge over defects up to a critical dimension that depends on the thickness of the film and the spin-coat material. The critical dimension will typically be at least 500 nm, or even at least 1000 nm. Otherwise the thin film conforms to and retains the tailored curvature of the underlying substrate, including its low roughness. This "bridging" over defects is schematically depicted in FIG. 5. Although the bridging schematically depicted in FIG. 5 illustrate no filling of the underlying defects, this is only one embodiment. In other embodiments, the film provides a smooth surface that bridges over the defect, but will also partially or totally fill in the underlying defect.

In step 130, the spin-coated substrate is removed from the spin-coating machine and cured to harden the thin-film formed on the substrate. For example, the spin-coated substrate can be placed in a curing oven and heated to temperatures of, e.g., 100° C. to 600° C., optionally in presence of ozone and/or together with exposure to ultraviolet light. For the case of HSQ as the spin-coat material, such curing steps drive of solvent and cross-link HSQ molecules to form a hard silicon oxide layer.

In step 135, the hardened, spin-coated substrate is again inspected for defects as in step 115 to determine whether the spin-coating has reduced the number of defects to an acceptable level. If not, the spin-coating and curing steps are optionally repeated.

In step 140, the hardened, spin-coated substrate is inspected for topology using an optical interferometer to ensure that the surface figure error remains within specification after the spin-coating. If not, a surface figure error map determined from the inspection in step 140 is then used in step 145 to guide surface figure correction using, for example, IBF.

In step 150, the figure-corrected substrate, including the hardened and spin-coated, thin film, is again inspected for defects to ensure that the no additional defects were introduced during the surface figure correction. If so, than the spin-coating and subsequent steps are optionally repeated.

In step 155, after it is has been established that the figure-corrected substrate including the hardened and spin-coated, thin film is within desired tolerances with respect to surface figure error, roughness, and number of defects, the substrate surface is optionally coated with multiple optical layers, such as alternating thin layers such of molybdenum and silicon to provide Bragg reflectivity for the substrate and form the final mirror for the EUV and/or X-ray optical system. Techniques for forming such multi-layer stacks are well-known in the art.

Further embodiments of the invention include, for example, the mirror formed by the method of the flow chart of FIG. 1.

Scope

It must be noted that as used herein and in the appended claims, the singular forms "a", "an", and "the" include plural referents unless the context clearly dictates otherwise, e.g., when the word "single" is used.

As used herein, the terms "adapted" and "configured" mean that the element, component or other subject matter is designed and/or intended to perform a given function. Thus, the use of the terms "adapted" and "configured" should not be construed to mean that a given element, component, or other subject matter is simply "capable of" performing a given function.

As used herein, the phrases "at least one of" and "one or more of," in reference to a list of more than one entity, means any one or more of the entity in the list of entity, and is not limited to at least one of each and every entity specifically listed within the list of entity. For example, "at least one of A and B" (or, equivalently, "at least one of A or B," or, equivalently, "at least one of A and/or B") may refer to A alone, B alone, or the combination of A and B.

As used herein, the term "and/or" placed between a first entity and a second entity means one of (1) the first entity, (2) the second entity, and (3) the first entity and the second entity. Multiple entity listed with "and/or" should be construed in the same manner, i.e., "one or more" of the entity so conjoined. Other entity may optionally be present other than the entity specifically identified by the "and/or" clause, whether related or unrelated to those entities specifically identified.

While this specification contains many specific implementation details, these should not be construed as limitations on the scope of any inventions or of what may be claimed, but rather as descriptions of features specific to particular embodiments of particular inventions.

Certain features that are described in this specification in the context of separate embodiments can also be implemented in combination in a single embodiment. Conversely, various features that are described in the context of a single embodiment can also be implemented in multiple embodiments separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of embodiments of the invention have been described. Nevertheless, it will be understood that various modifications may be made without departing from the spirit and scope of the invention. Accordingly, other embodiments are within the scope of the following claims.

What is claimed is:

1. A method of making a mirror for use with extreme ultraviolet (EUV) or X-ray radiation, the method comprising:
   a. providing an optical element having a curved mirror surface, wherein the curved mirror surface comprises localized defects that degrade performance of the curved mirror surface;
   b. spin-coating the curved mirror surface with a material to cover at least some of the defects; and
   c. curing the spin-coated material on the curved mirror surface to reduce the number of defects and improve the performance of the curved mirror surface, wherein the defects comprise any of scratches, pits, and digs having at least one lateral dimension smaller than 500 nm and larger than the size scale for high spatial frequency surface roughness HSFR that gives rise to diffuse scatter.

2. The method of claim 1, wherein the mirror surface has a high spatial frequency surface roughness HSFR less than 1 nm before the spin-coating.

3. The method of claim 2, wherein the mirror surface has a high spatial frequency surface roughness HSFR less than 0.45 nm before the spin-coating.

4. The method of claim 1, further comprising characterizing the number of defects on the mirror surface before the spin-coating.

5. The method of claim 1, further comprising characterizing the number of defects on the mirror surface after the spin-coating.

6. The method of claim 1, further comprising characterizing the number of defects on the mirror surface before and after the spin-coating.

7. The method of 6, wherein the characterizing comprises inspecting the mirror surface with an optical microscope over an area greater than 1 mm2.

8. The method of claim 7, wherein the optical microscope is a confocal microscope.

9. The method of claim 1, wherein the optical element comprises a substrate made of any of silicon, fused silica, quartz silicon, titanium-doped silica, glass ceramic, and polishable ceramic.

10. The method of claim 1, further comprising coating the cured, spin-coated mirror surface with multiple optical layers to provide a reflective mirror surface for the EUV or X-ray radiation.

11. The method of claim 10, wherein the multiple layers comprises layers of molybdenum and silicon.

12. The method of claim 1, wherein the mirror is for use in a wavelength range between 1 and 20 nm.

13. The method of claim 1, wherein the curved mirror surface is an aspheric mirror surface.

14. The method of claim 1, wherein the spin-coating comprises:
 a. depositing the material onto the curved mirror surface in the vicinity of a spin-coating rotation axis for the curved surface; and
 b. rotating the curved surface of the optical element about the rotation axis so that the glass-like material flows radially outward to cover the curved mirror surface and form a thin film.

15. The method of claim 14, wherein the rotating includes rotating the optical element at between 1000 to 5000 rotations per minute.

16. The method of claim 14, wherein the thin film is between 50 and 500 nm thick.

17. The method of claim 14, wherein the thin film is between 100 and 400 nm thick.

18. The method of claim 14, wherein the spin-coating further comprises rotating the curved surface after the deposition of the material to spin-off and evaporate excess material as the thin film is formed.

19. The method of claim 18, wherein the spin coating further comprises heating the curved mirror surface to help evaporate any solvents for the material.

20. The method of claim 14, wherein the curing comprises heating the spin-coated substrate in an oven in the presence of at least one of ozone and UV radiation.

21. The method of claim 20, wherein the oven is heated to a temperature between 100 degrees Celsius and 600 degrees Celsius.

22. The method of claim 1, wherein the material is a glass-like material.

23. The method of claim 1, wherein the glass-like material comprises hydrogen silsesquioxane or methylsiloxane.

24. The method of claim 1, wherein the number of defects is reduced to less than 1 defect per 1 square millimeter over the usable area of the curved mirror surface.

25. A mirror for use with extreme ultraviolet or x-ray radiation, the mirror comprising:
 a. an optical element having a curved mirror surface, wherein the curved mirror surface comprises localized defects that degrade performance of the curved mirror surface, wherein the defects comprise any of scratches, pits, and digs having at least one lateral dimension smaller than 500 nm and larger than the size scale for high spatial frequency surface roughness HSFR that gives rise to diffuse scatter; and
 b. a thin film formed on the curved mirror surface by:
 i. spin-coating the curved mirror surface with a material to cover at least some of the defects; and
 ii. curing the spin-coated material on the curved mirror surface to reduce the number of defects and improve the performance of the curved mirror surface.

26. The mirror of claim 25, wherein the mirror surface has a high spatial frequency surface roughness HSFR less than 1 nm before the spin-coating.

27. The mirror of claim 26, wherein the mirror surface has a high spatial frequency surface roughness HSFR less than 0.45 nm before the spin-coating.

* * * * *

UNITED STATES PATENT AND TRADEMARK OFFICE
CERTIFICATE OF CORRECTION

| | | |
|---|---|---|
| PATENT NO. | : 11,520,234 B2 | Page 1 of 1 |
| APPLICATION NO. | : 17/074674 | |
| DATED | : December 6, 2022 | |
| INVENTOR(S) | : John Matthew Kincade | |

It is certified that error appears in the above-identified patent and that said Letters Patent is hereby corrected as shown below:

In the Claims

<u>Column 9</u>

Line 4, in Claim 1, after "roughness" delete "HSFR" and insert -- (HSFR) --

Line 7, in Claim 2, after "roughness" delete "HSFR" and insert -- (HSFR) --

Line 10, in Claim 3, after "roughness" delete "HSFR" and insert -- (HSFR) --

Line 21, in Claim 7, after "of" insert -- claim --

Signed and Sealed this
Thirty-first Day of January, 2023

Katherine Kelly Vidal
*Director of the United States Patent and Trademark Office*